United States Patent
Hino et al.

(10) Patent No.: US 11,108,341 B2
(45) Date of Patent: Aug. 31, 2021

(54) ACTUATOR, OPTICAL DEVICE, AND PROJECTOR

(71) Applicant: SEIKO EPSON CORPORATION, Tokyo (JP)

(72) Inventors: Makiko Hino, Matsumoto (JP); Yasushi Mizoguchi, Suwa (JP)

(73) Assignee: SEIKO EPSON CORPORATION, Tokyo (JP)

( * ) Notice: Subject to any disclaimer, the term of this patent is extended or adjusted under 35 U.S.C. 154(b) by 514 days.

(21) Appl. No.: 16/173,011

(22) Filed: Oct. 29, 2018

(65) Prior Publication Data

US 2019/0131891 A1  May 2, 2019

(30) Foreign Application Priority Data

Oct. 30, 2017  (JP) .............................. JP2017-208895

(51) Int. Cl.
| | |
|---|---|
| *H02N 2/00* | (2006.01) |
| *H02N 2/10* | (2006.01) |
| *F16F 15/02* | (2006.01) |
| *G03B 21/20* | (2006.01) |
| *G02B 5/02* | (2006.01) |
| *G02B 27/48* | (2006.01) |
| *B81B 3/00* | (2006.01) |
| *H01L 41/09* | (2006.01) |

(52) U.S. Cl.
CPC ............ *H02N 2/008* (2013.01); *B81B 3/0078* (2013.01); *F16F 15/02* (2013.01); *G02B 5/02* (2013.01); *G02B 27/48* (2013.01); *G03B 21/2033* (2013.01); *H02N 2/001* (2013.01); *H02N 2/103* (2013.01); *H01L 41/09* (2013.01)

(58) Field of Classification Search
CPC ........ H02N 2/008; H02N 2/001; H02N 2/103; H01L 41/09; G03B 21/2033; G03B 21/208; G02B 5/02; G02B 27/48; F16F 15/02; F16F 15/073; B81B 3/0078
See application file for complete search history.

(56) References Cited

U.S. PATENT DOCUMENTS

| | | | | |
|---|---|---|---|---|
| 5,563,465 | A | * | 10/1996 | Nakahara ............. H02N 2/0025 310/317 |
| 5,616,980 | A | * | 4/1997 | Zumeris ............ G11B 7/08576 310/317 |
| 6,713,943 | B1 | | 3/2004 | Matsuda et al. |
| 2009/0091666 | A1 | | 4/2009 | Kurozuka et al. |
| 2012/0044557 | A1 | | 2/2012 | Isobe |

FOREIGN PATENT DOCUMENTS

| | | |
|---|---|---|
| JP | 2000-358387 A | 12/2000 |
| JP | 2009-229597 A | 10/2009 |
| JP | 2012-042742 A | 3/2012 |
| WO | 2007/105678 A1 | 9/2007 |

* cited by examiner

*Primary Examiner* — Emily P Pham
(74) *Attorney, Agent, or Firm* — Oliff PLC

(57) ABSTRACT

At least one of a first beam portion and second beam portions is provided with an out-of-plane vibration suppressing structure configured to suppress vibration of a movable portion in an out-of-plane direction vertical to an in-plane direction. Thus, unintentional occurrence of unintentional movement in the out-of-plane direction vertical to the in-plane direction can be suppressed. Furthermore, in this case, a size reduction of a device can be achieved in comparison with a case where a device includes a motor disposed for rotation driving, for example.

12 Claims, 8 Drawing Sheets

ACTUATOR, OPTICAL DEVICE, AND PROJECTOR

BACKGROUND

1. Technical Field

The disclosure relates to an actuator, an optical device, and a projector.

2. Related Art

A truss-type actuator provided with two piezoelectric elements orthogonal to each other and having a substantially identical natural frequency, and further provided with a chip member at an intersection of the two piezoelectric elements is known, and in the truss-type actuator, the two piezoelectric elements are separately driven, and are driven to delineate an elliptical trajectory with respect to the chip member as a target (see JP-A-2000-358387).

In JP-A-2000-358387 described above, although motion of a plane delineating an elliptical trajectory is taken into consideration, vibration in a direction out of the plane is not taken into consideration. However, unintentional vibration in the direction out of the plane may have adverse influence. For example, it is conceivable that when an optical element disposed in an optical path in an optical system is operated by an actuator, unintentional vibration by the actuator may direct the optical path to an unexpected direction.

SUMMARY

An advantage of some aspects of the embodiment is to provide an actuator capable of suppressing unintentional vibration in a direction other than an in-plane direction to achieve given movement, an optical device including the actuator, and a projector.

An actuator according to an aspect of the embodiment includes a movable portion, a first beam portion coupled to the movable portion, a second beam portion coupled to the first beam portion and extending in a direction different from a direction of the first beam portion, and a driving portion configured to cause the movable portion to undergo curvilinear motion via the first beam portion and the second beam portion by vibration in an in-plane direction of a plane parallel to the direction in which the first beam portion extends and the direction in which the second beam portion extends. At least one of the first beam portion and the second beam portion includes an out-of-plane vibration suppressing structure configured to suppress vibration of the movable portion in an out-of-plane direction vertical to the in-plane direction.

In the above-described actuator, at least one of the first beam portion and the second beam portion is provided with the out-of-plane vibration suppressing structure configured to suppress vibration of the movable portion in the out-of-plane direction vertical to the in-plane direction. Thus, unintentional occurrence of unintentional movement in the out-of-plane direction vertical to the in-plane direction can be suppressed.

In a specific aspect of the embodiment, the out-of-plane vibration suppressing structure has a thickness in the out-of-plane direction larger than a thickness in the in-plane direction in at least one of the first beam portion and the second beam portion. In this case, an increase in the thickness in the out-of-plane direction increases a natural frequency in the out-of-plane direction, and thus vibration can be suppressed.

In another aspect of the embodiment, the first beam portion constitutes an inner beam extending in a first direction and including the movable portion mounted at the center, and the second beam portion constitutes a pair of outer beams provided at both ends of the first beam portion and extending in a second direction. In this case, the first beam portion constituting the inner beam directly vibrates the movable portion, whereas the second beam portion vibrates the first beam portion on which the movable portion is mounted, and thus complex vibration based on two vibration directions can be caused in the in-plane direction.

In still another aspect of the embodiment, the first beam portion constituting the inner beam includes a hole. In this case, the first beam portion is provided with the hole to change a spring constant of the first beam portion, and resonant frequencies in the two vibration directions can be adjusted.

In still another aspect of the embodiment, the first beam portion includes, as the out-of-plane vibration suppressing structure, a plurality of members spaced apart from each other and extending in parallel to the direction in which the first beam portion extends. In this case, for example, movement (tilt) of a plane parallel to the in-plane direction toward the out-of-plane direction side can be suppressed.

In still another aspect of the embodiment, the actuator further includes a vibration separating portion provided at a coupling place at which the first beam portion intersects the second beam portion and configured to separate vibration. In this case, vibration is separated into the two vibration directions with the vibration separating portion as a reference.

In still another aspect of the embodiment, the driving portion is disposed along the direction in which the first beam portion extends. In this case, both of the first beam portion constituting the inner beam and the second beam portion constituting the outer beams can be caused to vibrate with reliability.

In still another aspect of the embodiment, the movable portion undergoes, as the curvilinear motion by the driving portion, motion maintaining movement in at least one of two vibration directions generated by excitation from the driving portion. In this case, the movable portion can be caused to make movement without stopping at any moment.

In still another aspect of the embodiment, the first beam portion and the second beam portion are configured to cause a resonant mode different from a resonant mode corresponding to vibration in the out-of-plane direction to be a resonant mode corresponding to vibration in the in-plane direction, and the driving portion is configured to operate at a driving frequency corresponding to the resonant mode in the in-plane direction and cause the movable portion to resonate and vibrate. In this case, while vibration in the out-of-plane direction is suppressed, driving with high efficiency by resonance and vibration can be achieved in the in-plane direction.

An optical device according to an aspect of the embodiment includes the actuator according to any of the above-described aspects, and an optical element provided in the movable portion and configured to undergo the curvilinear motion.

The above-described optical device includes the above-described actuator, and thus suppression of unintentional vibration in the out-of-plane direction and movement of the movable portion without stopping at any moment can be achieved. Further, a size reduction of a device can be achieved in comparison with a case where a device includes a motor disposed for rotation driving, for example.

In a specific aspect of the embodiment, the optical element includes a light diffusion plate. In this case, the light diffusion plate is caused to make the curvilinear motion as described above, and thus, for example, a speckle of laser light reflected by the light diffusion plate can be reduced.

A projector according to an aspect of the embodiment includes the optical device according to the above-described aspect, and is configured to perform image projection with laser light reflected by the optical device. In this case, excellent image display in which a speckle due to the laser light is reduced can be performed.

The above-described projector includes the above-described optical device, namely, the above-described actuator, and can thus perform excellent image display in which a speckle due to the laser light is reduced, for example.

BRIEF DESCRIPTION OF THE DRAWINGS

The embodiment will be described with reference to the accompanying drawings, wherein like numbers reference like elements.

DESCRIPTION OF EXEMPLARY EMBODIMENTS

First Exemplary Embodiment

Hereinafter, an example of an actuator according to a first exemplary embodiment will be described in detail with reference to FIGS. 1A and 1B and the like.

Figure 1A:
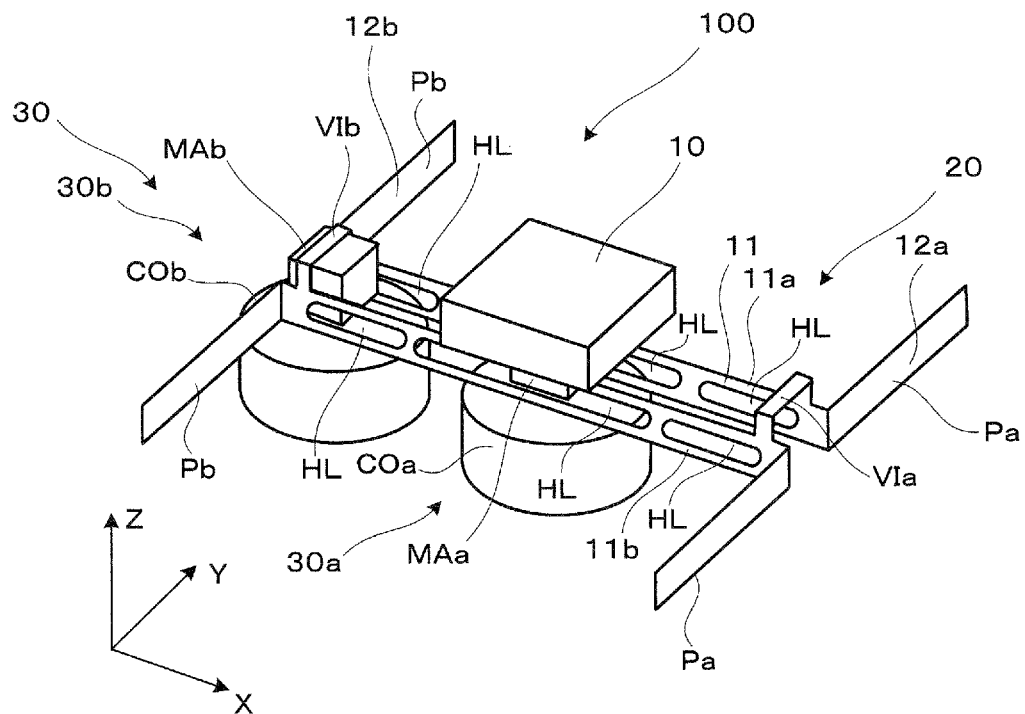
FIG. 1A is a perspective view for describing an actuator according to a first exemplary embodiment.
Figure 1B:
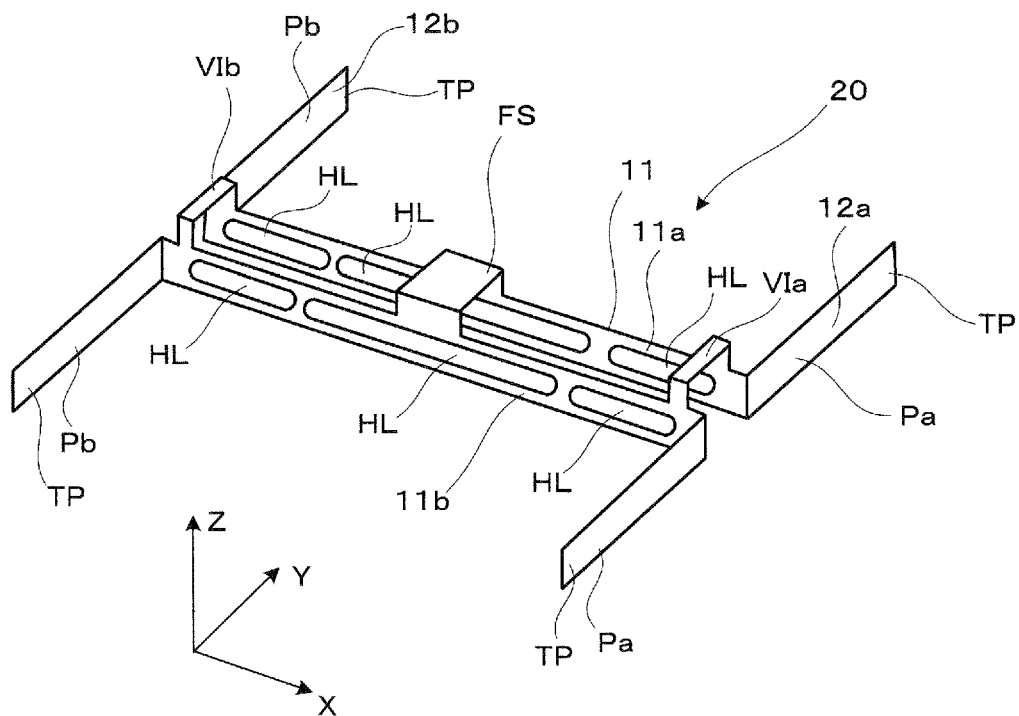
FIG. 1B is a perspective view for describing a beam structural portion constituting the actuator.

As illustrated in FIGS. 1A and 1B, an actuator 100 in the first exemplary embodiment includes a movable portion 10, a beam structural portion 20 on which the movable portion 10 is mounted and fixed and which is configured to transmit vibration, and a driving portion 30 configured to drive the movable portion 10 via the beam structural portion 20.

First, in the actuator 100, the movable portion 10 is a member having a plane portion (rectangular surface portion in the case illustrated), and is a driven portion including an optical element such as a light diffusion plate attached to the plane portion, for example, and being movable by being driven by the driving portion 30 and the like. It is assumed here that the plane portion of the movable portion 10 is a reference surface (horizontal surface), and, in the reference surface, a direction (lateral direction) of one side of the movable portion 10 having a rectangular shape is an X direction, and a direction (longitudinal direction) of another side vertical to the X direction is a Y direction. Furthermore, it is assumed that a direction vertical to both of the X direction and the Y direction, namely, a direction vertical to the reference surface is a Z direction. Further, it is assumed that a direction parallel to an XY plane is an in-plane direction, and a direction vertical to the XY plane, namely, the Z direction is an out-of-plane direction. The movable portion 10 is movable in the in-plane direction by the beam structural portion 20 and the driving portion 30.

Further, in the actuator 100, the beam structural portion 20 is a vibration member configured to support the movable portion 10 and coupled to a part of the driving portion 30 to receive excitation force and vibrate. In the first exemplary embodiment, as illustrated in FIG. 1B, for example, the beam structural portion 20 is formed by bending a metallic member (member having sufficient resistance and elasticity such as copper) of one plate into an H shape. The beam structural portion 20 includes a fixed support portion FS as a central portion on which the movable portion 10 is mounted, a first beam portion 11 extending to left and right in the X direction (lateral direction) with the fixed support portion FS as the center, a pair of second beam portions 12a and 12b provided at both ends of the first beam portion 11 and extending up and down in the Y direction (longitudinal direction), and a pair of vibration separating portions VIa and VIb provided at coupling places at which the first beam portion 11 intersects the second beam portions 12a and 12b and configured to separate vibration into two directions.

In the beam structural portion 20, the first beam portion 11 constitutes an inner beam on which the movable portion 10 is mounted by the fixed support portion FS at the center and which is disposed on a side relatively close to the movable portion 10, and the first beam portion 11 includes two plate members 11a and 11b spaced apart from each other and extending in parallel to the X direction as a direction in which the two plate members 11a and 11b extend. The plate members 11a and 11b are each provided with a hole HL.

The pair of second beam portions 12a and 12b constitute outer beams disposed at ends on a +X side and a −X side of the first beam portion 11, respectively, and each include two plate members extending in the Y direction via the vibration separating portions VIa and VIb provided corresponding to the pair of second beam portions 12a and 12b. For example, as for a second beam portion 12a disposed on the +X side, two plate members Pa and Pa extending in the Y direction are connected to each other via the vibration separating portion VIa having a U shape to constitute the one second beam portion 12a. Similarly, as for a second beam portion 12b, two plate members Pb and Pb extending in the Y direction are connected to each other via the vibration separating portion VIb having a U shape to constitute the one second beam portion 12b. Note that tip portions TP of the second beam portions 12a and 12b are each fixed by a fixing portion (not illustrated).

The pair of vibration separating portions VIa and VIb serve as U-shaped coupling places made in association with bending a metallic member of one plate to form the beam structural portion 20. As described below with reference to FIGS. 3A and 3B, in the first exemplary embodiment, the vibration separating portions VIa and VIb function to separate vibration by the first beam portion 11 from vibration by the second beam portions 12a and 12b. Furthermore, here, the vibration separating portion VIb also functions as a housing portion in which a part of the driving portion 30 is housed and fixed (see FIG. 1A).

Here, the first and second beam portions 11, 12a, and 12b or the plate members 11a, 11b, Pa, and Pb constituting the first and second beam portions 11, 12a, and 12b each have a relatively large thickness in the out-of-plane direction (Z direction) and a relatively small thickness in the in-plane direction (direction parallel to the XY plane). Note that the "small thickness in the in-plane direction" here means a small width in a direction vertical to a direction of the in-plane direction in which the plate member extends. In other words, in the case illustrated, the first beam portion 11 has a small thickness in the Y direction, and the second beam portions 12a and 12b each have a small thickness in the X direction. The actuator 100 in the first exemplary embodiment includes such a structure having the thickness in the in-plane direction larger than the thickness in the out-of-plane direction and thus, the actuator 100 in the first exemplary embodiment includes a structure configured to suppress vibration in the out-of-plane direction (Z direction), namely, an out-of-plane vibration suppressing structure.

Figure 3A:
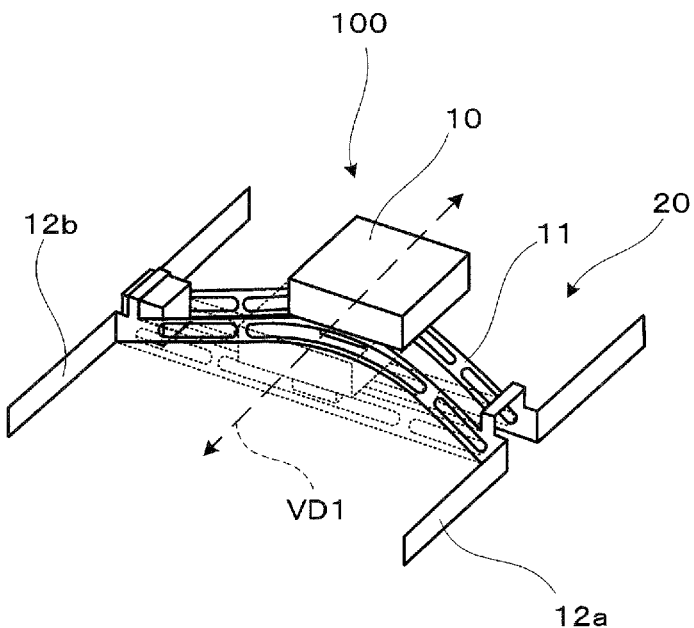
FIG. 3A illustrates a perspective view illustrating a state of vibration in a first vibration direction by a first beam portion.
Figure 3B:
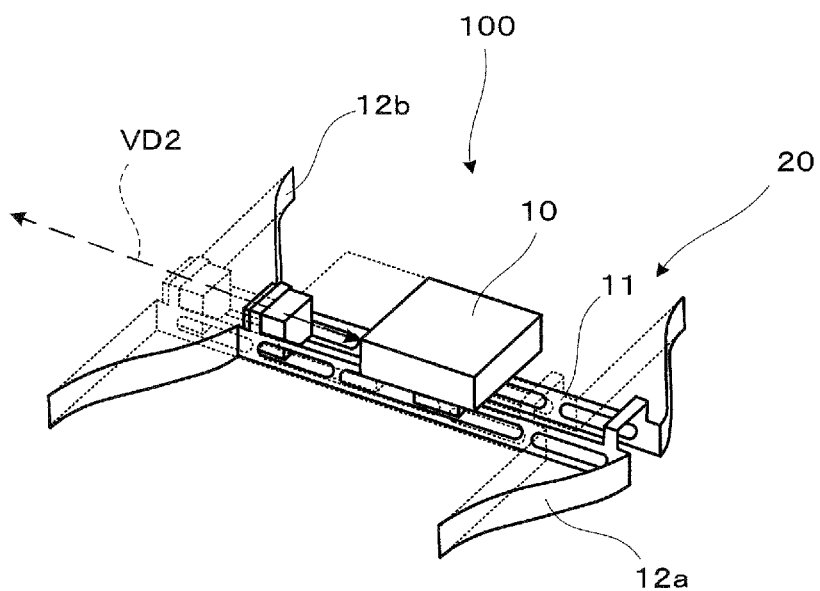
FIG. 3B illustrates a perspective view illustrating a state of vibration in a second vibration direction by a second beam portion.

The beam structural portion 20 includes the above-described structure and thus, the first and second beam portions 11, 12a, and 12b being metallic (such as copper) plate members deform as illustrated in FIGS. 3A and 3B to function as spring members configured to move the movable portion 10 in the in-plane direction.

With reference to FIG. 1A and the like again, in the actuator 100, the driving portion 30 includes two (two pairs of) driving mechanisms. Specifically, the driving portion 30 includes a first driving portion 30a including one permanent magnet MAa and one coil COa and a second driving portion 30b including one permanent magnet MAb and one coil COb. In other words, an AC current is caused to flow at a predetermined driving frequency as a driving current through each of the coils COa and COb, and thus the beam structural portion 20 is excited by using Lorentz force generated between the coils COa and COb and the corresponding permanent magnets MAa and MAb to drive the movable portion 10. In the illustrated example, the permanent magnet MAa of the first driving portion 30a is housed in the fixed support portion FS provided in the beam structural portion 20, and the permanent magnet MAb of the second driving portion 30b is housed in the vibration separating portion VIb provided in the beam structural portion 20, whereas the coil COa is disposed directly below (on the −Z side of) the fixed support portion FS and fixed, and the coil COb is disposed directly below (on the −Z side of) the vibration separating portion VIb and fixed. In other words, the permanent magnets MAa and MAb of the driving portion 30 serve as beam portion side-driving elements attached to the beam structural portion 20, and the permanent magnets MAa and MAb are driven in association with a change in a current flowing through the coils COa and COb, respectively. However, this is an example, and a configuration other than the above-described configuration may be used as long as excitation in a given direction described below can be achieved.

Note that in the beam structural portion 20 including the configuration as described above, the first driving portion 30a and the second driving portion 30b are disposed along the direction in which the first beam portion 11 extends, and thus both of the first beam portion 11 constituting the inner beam and the second beam portions 12a and 12b constituting the outer beams can be caused to vibrate with reliability.

Hereinafter, an operation of the actuator 100 in the first exemplary embodiment will be described with reference to FIG. 2 and the like. Note that FIG. 2 is a view schematically illustrating a part of the actuator 100 as seen from the bottom side.

Figure 2:
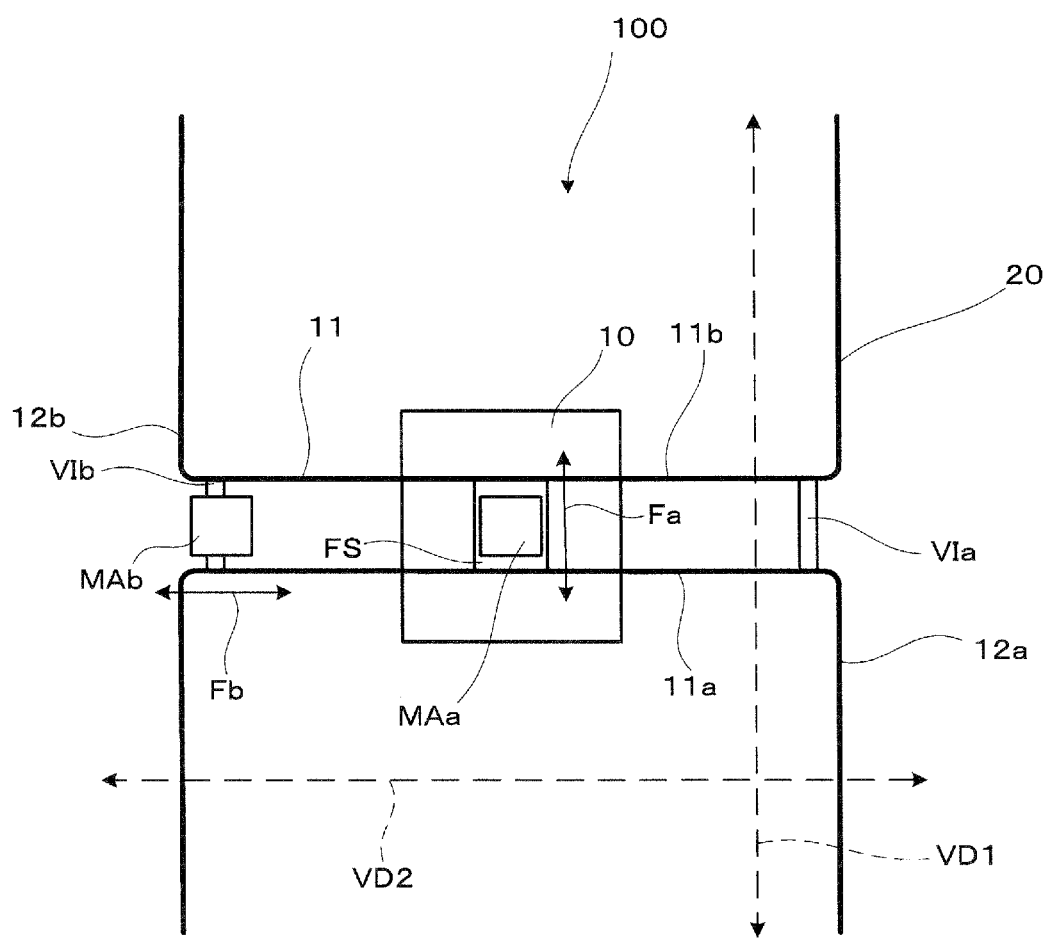
FIG. 2 illustrates a plan view for schematically describing excitation of the beam structural portion and a state of vibration of the beam structural portion.

First, in the first exemplary embodiment, as exemplified in FIG. 2, the first driving portion 30a of the driving portion 30 exerts excitation force Fa on the beam structural portion 20 in the ±Y directions. Furthermore, the first driving portion 30b exerts excitation force Fb on the beam structural portion 20 in the ±X directions. Here, it is assumed as an example that, at the time of startup, a direction of a magnetic field of a permanent magnet MA and a current direction of a coil CO are adjusted for the driving portion 30 to exert the excitation force Fa on the beam structural portion 20 in the +Y direction and to exert the excitation force Fb on the beam structural portion 20 in the +X direction. Note that an AC current at a predetermined driving frequency flows through each of the driving portions 30a and 30b, and thus the magnitude of the AC current changes in association with a change in a driving current including the case of positive and negative current.

In the case of the configuration described above, as illustrated in FIG. 2 or 3A, the first beam portion 11 vibrates in the Y direction as a first vibration direction VD1. On the other hand, as illustrated in FIG. 3B, the second beam portions 12a and 12b vibrate in the X direction as a second vibration direction VD2. Furthermore, in this case, the pair of vibration separating portions VIa and VIb function as a reference for separating vibration in the first vibration direction VD1 from vibration in the second vibration direction VD2.

As described above, in the case of movement made by a combination of vibration in the two directions, for example, a circular operation or a more complicated operation can be made as a whole. Thus, the movable portion 10 is caused to make, for example, curvilinear motion maintaining movement in at least one direction of the two vibration directions VD1 and VD2 without a velocity component of zero in any of the vibration directions, that is, without stopping at any moment. Here, the movable portion 10 undergoes relatively simple circular or elliptical movement as an example. In this way, there is no place where a velocity component becomes zero and thus, for example, when a light diffusion plate is attached to the movable portion 10 and disposed on an optical path of laser light, a speckle of laser light is visually recognized at a moment when the velocity component becomes zero, but occurrence of such a situation can be reduced.

Here, as described above, motion in the out-of-plane direction (Z direction), namely, vibration in the out-of-plane direction (out-of-plane vibration) may further be suppressed as much as possible from a viewpoint of attaching and using the light diffusion plate to reduce a speckle. To achieve this, a resonant mode in which the out-of-plane direction (Z direction) is a vibration direction may be different from the resonant modes corresponding to the above-described two vibration directions VD1 and VD2. In other words, it is ideal that resonant frequencies (natural frequencies) of the resonant modes are greatly different, particularly, a resonant frequency (natural frequency) of the resonant mode in which the out-of-plane direction (Z direction) is the vibration direction is higher.

In contrast, in the first exemplary embodiment, as described above, the actuator 100 includes the out-of-plane vibration suppressing structure in which the first and second beam portions 11, 12a, and 12b each have a relatively large thickness in the out-of-plane direction (Z direction) and a relatively small thickness in the in-plane direction (direction parallel to the XY plane). In other words, an increase in the thickness in the out-of-plane direction (Z direction) increases a natural frequency in the out-of-plane direction to make a great difference between the resonant mode in the in-plane direction and the resonant mode in the out-of-plane direction as described above, and even when vibration corresponding to the resonant modes corresponding to the two vibration directions VD1 and VD2 and generating intentional movement in the in-plane direction is generated, vibration in the out-of-plane direction (Z direction) generating unintentional movement can be suppressed.

As a reason that vibration in the out-of-plane direction (Z direction) can be suppressed by increasing a resonant frequency, it is conceivable that even when the same force is exerted by increasing a spring constant, displacement of vibration reduces, and that the displacement is multiplied by a Q value owing to resonance, but damping constituting the Q value increases with a higher resonant frequency and thus, the Q value becomes relatively small and even when the displacement is multiplied by the Q value, the displacement of vibration reduces.

Note that, in the illustrated example, each of the first beam portion 11 and the second beam portions 12a and 12b includes the out-of-plane vibration suppressing structure configured to suppress vibration of the movable portion 10 in the out-of-plane direction vertical to the in-plane direction, but, for example, any one of the first beam portion 11 and the second beam portions 12a and 12b may include the out-of-plane vibration suppressing structure as described above as long as appropriate out-of-plane vibration suppression can be achieved.

Furthermore, in the first exemplary embodiment, the first beam portion 11 includes the plurality of (two in the illustrated example) plate members 11a and 11b spaced apart from each other and extending in parallel to the direction in which the two plate members 11a and 11b extend. In this case, for example, movement (tilt) of a plane parallel to the in-plane direction toward the out-of-plane direction can be suppressed. In other words, tilting of the surface of the movable portion 10 can be suppressed. Particularly, in the first exemplary embodiment, the first beam portion 11 constituting the inner beam directly coupled to the movable portion 10 includes the out-of-plane vibration suppressing structure by the plate members 11a and 11b as described above, and thus tilting of the movable portion 10 can be suppressed with reliability. In the first exemplary embodiment, the two plate members are provided, but a plurality of plate members such as three or four plate members may be provided.

Here, it is ideal that when vibration is generated in the corresponding two vibration directions VD1 and VD2, respectively with the excitation force Fa and Fb exerted in the two directions by the first and second driving portions 30a and 30b including the two (the two pairs of) driving mechanisms as described above, a driving frequency of each of the driving portions 30a and 30b is identical to a resonant frequency (natural frequency) of each of the two resonant modes (vibration modes) corresponding to the two vibration directions VD1 and VD2. In this case, the movable portion 10 can be driven with very high efficiency by resonance and vibration.

Further, it is conceivable that in the two resonant modes corresponding to the two vibration directions VD1 and VD2, a region having a high gain may be distributed in the range having frequencies higher than a certain degree to avoid influence of other unintentional vibration (ambient vibration). This is because, for example, vibration at a frequency of around 60 Hz may be transmitted through various surroundings. Further, it is conceivable that also from a viewpoint of, for example, attaching and using a light diffusion plate to reduce a speckle, vibration at a frequency of, for example, greater than or equal to 30 Hz is used to achieve the function of the light diffusion plate. On the other hand, when the frequency is too high, large driving force (excitation force) is also to be used for vibration. From the above-described viewpoint, for example, the two resonant modes may be identical with a value of, for example, approximately 120 Hz as a peak. Note that, various methods for the adjustment are conceivable, and, for example, it is conceivable that the first beam portion 11 is provided with the hole HL.

As described above, in the first exemplary embodiment, at least one of the first beam portion 11 and the second beam portions 12a and 12b is provided with the out-of-plane vibration suppressing structure configured to suppress vibration of the movable portion 10 in the out-of-plane direction vertical to the in-plane direction. Thus, unintentional occurrence of unintentional movement in the out-of-plane direction vertical to the in-plane direction can be suppressed. Furthermore, in this case, a size reduction of a device can be achieved in comparison with a case where a device includes a motor disposed for rotation driving, for example.

Second Exemplary Embodiment

Hereinafter, an actuator according to a second exemplary embodiment will be described with reference to FIG. 4 and the like. The second exemplary embodiment is a modification of the first exemplary embodiment. The actuator according to the second exemplary embodiment is the same as the actuator according to the first exemplary embodiment, except for a configuration of a driving portion, and thus the same reference signs are assigned to respective members having the same functions, and detailed description of each portion will be omitted.

Figure 4:
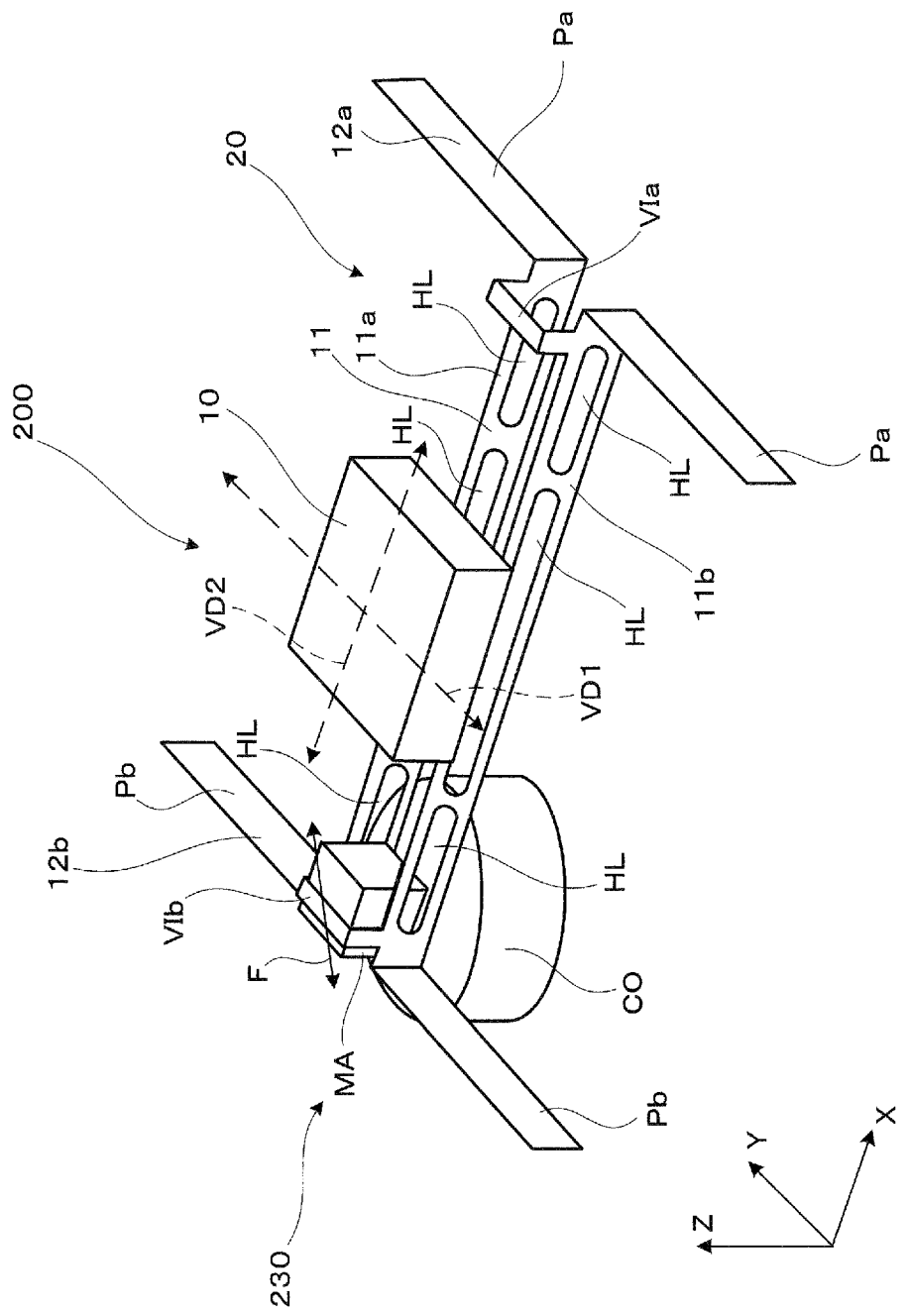
FIG. 4 illustrates a perspective view for describing an actuator according to a second exemplary embodiment.

As illustrated in FIG. 4, an actuator 200 according to the second exemplary embodiment includes a movable portion 10, a beam structural portion 20 on which the movable portion 10 is mounted and fixed and which is configured to transmit vibration, and a driving portion 230 configured to drive the movable portion 10 via the beam structural portion 20.

Hereinafter, a driving portion 230 in the actuator 200 will be described with reference to FIG. 4. Note that the movable portion 10 and the beam structural portion 20 are identical to the movable portion 10 and the beam structural portion 20 in the first exemplary embodiment, and thus description of the movable portion 10 and the beam structural portion 20 will be omitted.

In contrast to the driving portion 30 (see FIG. 1A) exemplified in the first exemplary embodiment, the driving portion 230 includes one (a pair of) driving mechanism including one permanent magnet MA and one coil CO. In other words, an AC current is caused to flow as a driving current through the coil CO, and thus the beam structural portion 20 is excited by using Lorentz force generated between the permanent magnet MA and the coil CO to drive the movable portion 10. In the illustrated example, the permanent magnet MA is housed in a vibration separating portion VIb provided in the beam structural portion 20, whereas the coil CO is disposed directly below (on the −Z side of) the vibration separating portion VIb and fixed. In other words, the permanent magnet MA of the driving portion 230 serves as a beam portion side-driving element attached to the beam structural portion 20, and the permanent magnet MA is driven (moved) in association with a change in a current flowing through the coil CO. Herein, it is assumed as an example that, at the time of startup, a direction of a magnetic field of the permanent magnet MA and a direction of a current of the coil CO are adjusted for the driving portion 230 to exert excitation force F on the beam structural portion 20 at an angle of elevation of 45° to the +X direction. In other words, the excitation force F is exerted in a direction different from any of the two vibration directions VD1 and VD2 defined by the beam structural portion 20. Furthermore, the direction of the excitation force F is different from a direction in which each of the beam portions 11, 12a, and 12b extends, that is, the direction of the excitation force F is assumed to be a direction not parallel to any of the X direction and the Y direction.

In the case of the configuration described above, as with the case illustrated in FIGS. 3A and 3B in the first exemplary embodiment, the first beam portion 11 vibrates in the Y direction as the first vibration direction VD1, and the second beam portions 12a and 12b vibrate in the X direction as the second vibration direction VD2.

However, the description above is an example, and disposition of the driving portion 230 and the like may be other than the above-described disposition and the like as long as excitation can be caused in a given direction as described above.

Here, it is ideal that to generate vibration in both of the two vibration directions VD1 and VD2 with the excitation force F exerted in one direction in a certain period of time by the driving portion 230 including the one (the pair of) driving mechanism as described above, the two vibration directions VD1 and VD2 have an identical resonant mode (vibration mode) and a resonant frequency (natural frequency) in the identical resonant mode is identical to a driving frequency of the driving portion 230. In this case, the driving portion 10 can be driven with very high efficiency by resonance and vibration. Therefore, first, in this case, two resonant modes corresponding to the two vibration directions VD1 and VD2 are provided, and the resonant modes are set to be identical. In the second exemplary embodiment, the two resonant modes are defined by shapes, disposition, weights, and the like of the movable portion 10, the beam structural portion 20, and the permanent magnet MA incorporated in the driving portion 230 and serving as a beam portion side-driving element attached to the beam structural portion 20. It is particularly conceivable that the two resonant modes can be set to be substantially identical by providing a hole HL to the first beam portion 11 constituting the inner beam.

Furthermore, as for the resonant modes, as with the case of the first exemplary embodiment, from viewpoints of avoiding influence of other unintentional vibration (ambient vibration) and of attaching the light diffusion plate to reduce a speckle, and further from a viewpoint that when the frequency is too high, large driving force (excitation force) is also to be used for vibration, when the two resonant modes are set to be substantially identical, the two resonant modes may be set to be identical with a value of, for example, approximately 120 Hz as a peak. Note that various methods for the adjustment are conceivable, and, for example, it is conceivable that the first beam portion 11 and the like are provided with the hole HL as described above.

Figure 5:
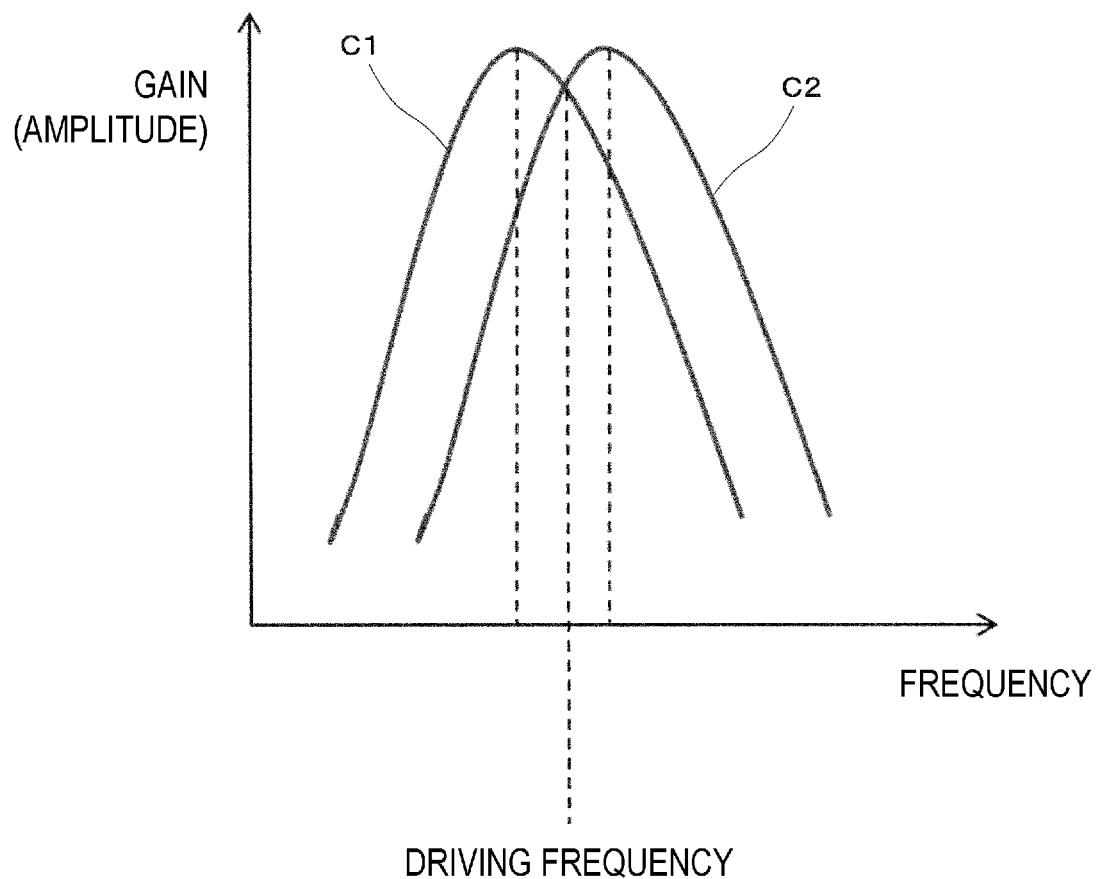
FIG. 5 illustrates a graph illustrating a relationship between two resonant modes corresponding to two vibration directions and a driving frequency.

However, in an actual device, even when the adjustment and the like as described above are made, two resonant modes may still be different owing to, for example, a manufacturing error and the like, as exemplified in FIG. 5. Here, two resonant modes corresponding to two vibration directions and a driving frequency are examined with reference to a graph illustrated in FIG. 5 and the like.

First, as described above, curved lines C1 and C2 indicating two resonant modes illustrated in FIG. 5 are slightly different from each other. Note that it is assumed that a horizontal axis is a frequency and a vertical axis is a gain (corresponding to efficiency, or an amplitude of the movable portion 10) in FIG. 5. In other words, a frequency corresponding to a peak of a gain indicated by each of the curved lines C1 and C2 is a resonant frequency (natural frequency) of the resonant mode capable of generating the most efficient vibration. In the second exemplary embodiment, a frequency within the range in which the gains of the resonant frequencies corresponding to the two resonant modes overlap each other is a driving frequency (in the illustrated example, the highest place in the range in which the gains overlap each other is located around the middle of the peaks of the curved lines C1 and C2) and thus, appropriate driving can be ensured.

Figure 6A:
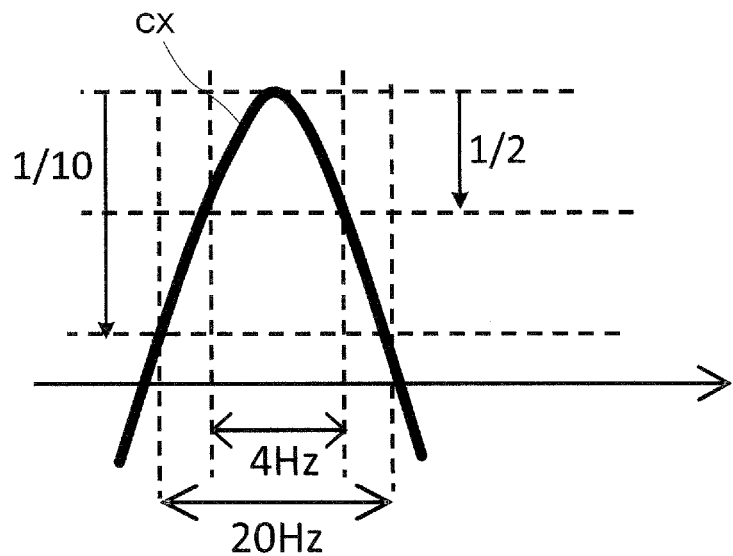
FIG. 6A illustrates a view for describing the allowable range of an amount of deviation between the resonant modes and the allowable range of the driving frequency.
Figure 6B:
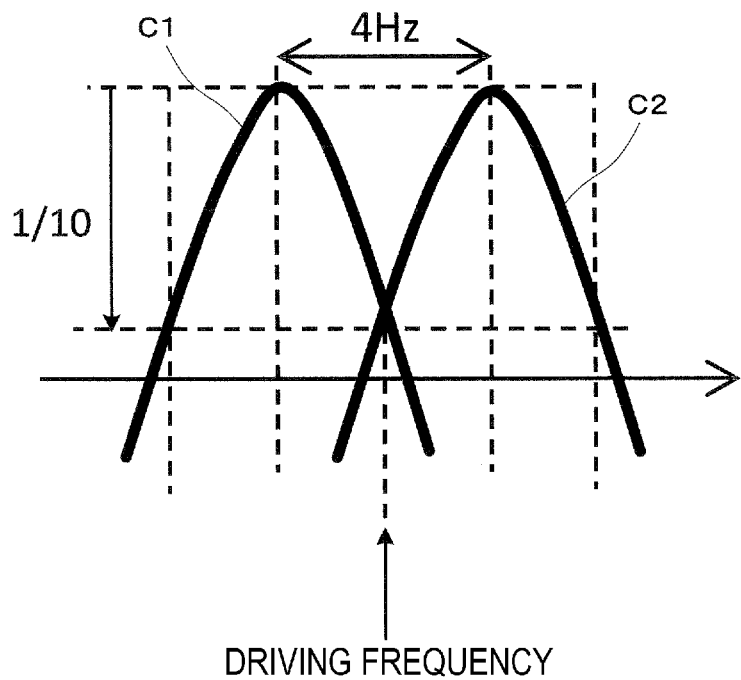
FIG. 6B illustrates a view for describing the allowable range of an amount of deviation between the resonant modes and the allowable range of the driving frequency.

Hereinafter, the allowable range of an amount of deviation in the two resonant modes and the allowable range of the driving frequency are further examined with reference to FIGS. 6A and 6B. FIG. 6A is a view for examining the allowable range of the driving frequency when the two resonant modes are identical (identical at 120 Hz, for example). In this case, assuming that the usable range is set up to the range in which a value of a gain (amplitude) of a curved line CX indicating the identical resonant mode is ½ (half), the allowable range of the driving frequency with a resonant frequency (natural frequency) of the resonant mode as the center is within a width of approximately 4 Hz. Furthermore, assuming that the usable range is set up to the range in which a value of a gain (amplitude) is ⅟10, the allowable range of the driving frequency is within a width of approximately 20 Hz. On the other hand, FIG. 6B is a view for examining the allowable range of an amount of deviation when the two resonant modes are not identical (when the two resonant modes are deviated from 120 Hz as a reference, for example). In this case, it is conceivable that an allowable amount of the deviation is approximately 4 Hz. When the amount of the deviation is approximately 4 Hz, a value at which gains (amplitudes) in both of the resonant modes are maximum is ⅟10 of the case of a peak in each of the resonant modes. Thus, there is no more efficient driving frequency to be selected.

It is conceivable from the above-described examination that any of the allowable range of an amount of deviation between two resonant modes and the allowable range of a driving frequency may be within several Hz at most.

As described above, also in the second exemplary embodiment, at least one of the first beam portion 11 and the second beam portions 12a and 12b is provided with an out-of-plane vibration suppressing structure configured to suppress vibration of the movable portion 10 in the out-of-plane direction vertical to the in-plane direction is provided. Thus, unintentional occurrence of unintentional movement in the out-of-plane direction vertical to the in-plane direction can be suppressed. Furthermore, in this case, a size reduction of a device can be achieved in comparison with a case where a device includes a motor disposed for rotation driving, for example, and particularly, the driving portion 230 includes the one (the pair of) driving mechanism and thus, a size reduction can further be achieved.

Third Exemplary Embodiment

Hereinafter, an optical device in which the above-described actuator is installed and a projector according to a third exemplary embodiment will be described with reference to FIG. 7. Here, an optical device 900 in which the actuator 100 exemplified in the first exemplary embodiment is installed is exemplified as an example, but another actuator may be installed.

Figure 7:
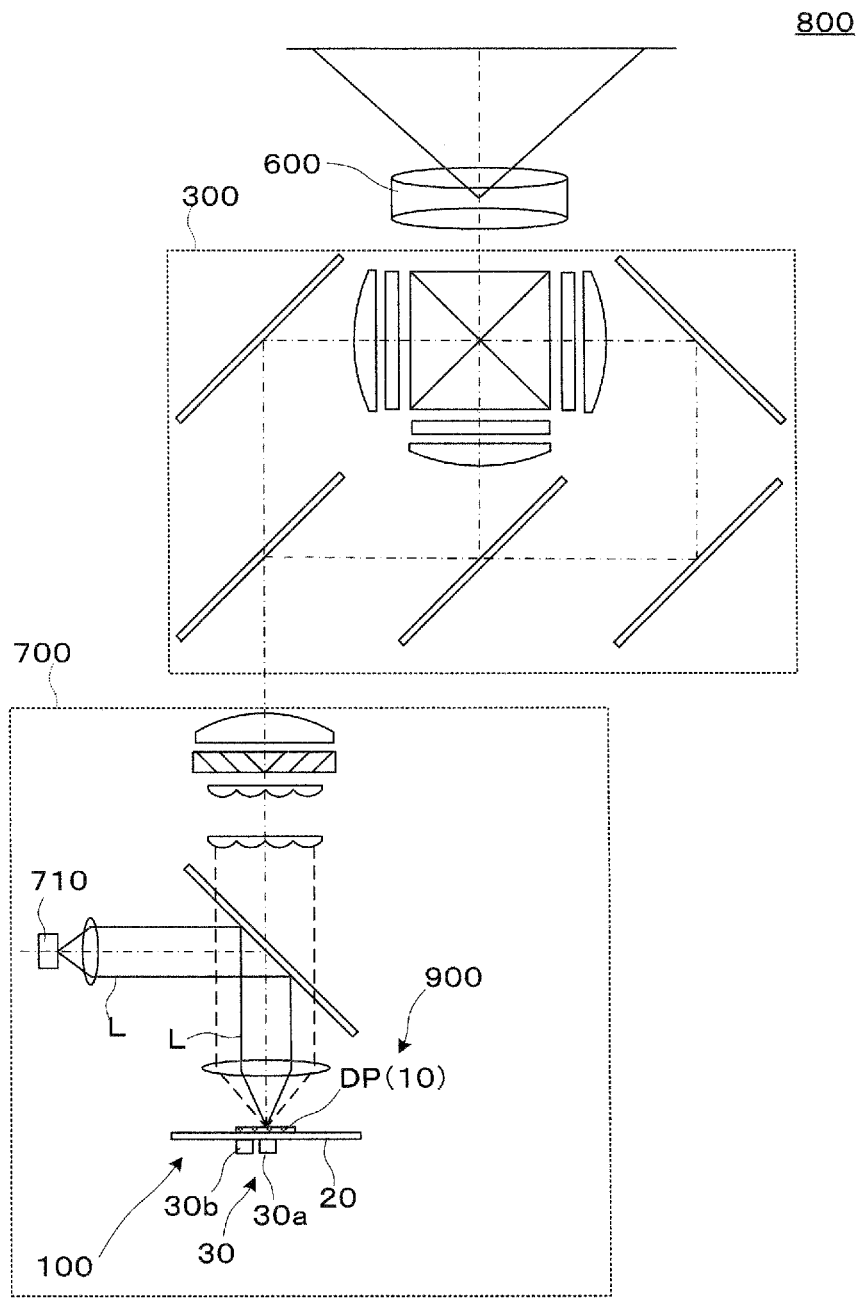
FIG. 7 is a plan view for describing an optical device and a projector according to a third exemplary embodiment.

A projector 800 illustrated in FIG. 7 includes a light source device 700 configured to eject laser light, an image formation optical system 300, and a projection optical system 600.

The light source device 700 includes a light source device 710 and the like in addition to the optical device 900 in which the actuator 100 is installed.

Here, the optical device 900 in the third exemplary embodiment is a device including a light diffusion plate DP as an optical element at a place of the movable portion 10 of the actuator 100, and configured to cause the light diffusion plate DP to undergo curvilinear motion by the actuator 100 and thus appropriately disturb and reflect a phase of incident laser light to reduce a speckle. The light diffusion plate DP has irregularities formed on a surface of an aluminum plate, for example, and further includes a dielectric multilayer film, a metallic reflection film, and the like formed on the surface.

The light source device 710 ejects laser light L in three colors of RGB. The laser light L ejected is ejected toward the optical device 900 of a reflection type via a collimating lens, a light separating element, and the like. The laser light L is moderately diffused and reflected by the light diffusion plate DP of the optical device 900. At this time, the laser light is in a state where a phase of the laser light is moderately disturbed. The laser light L in such a state is further ejected toward the image formation optical system 300 via an illumination optical system including a lens array, a polarization converting element, a superimposed lens, and the like. Furthermore, the laser light L is color-separated and light-guided by a dichroic mirror, a reflection mirror, and the like constituting the image formation optical system 300, and is light-modulated by a liquid crystal light modulation device provided for each color, and is further combined by a cross dichroic prism. The combined components are projected onto the projection optical system 600. Accordingly, the projector 800 performs image projection.

In the third exemplary embodiment, the optical device 900 includes the actuator 100, and the projector 800 includes the optical device 900. In the optical device, occurrence of unintentional movement in the out-of-plane direction of the surface of the light diffusion plate DP can be suppressed, and a situation where an optical path is changed to an unintentional direction in the light diffusion plate DP can be avoided. Further, movement of the light diffusion plate DP without stopping at any moment can be achieved. Furthermore, a size reduction of a device can be achieved in comparison with a case where a device includes a motor disposed for rotation driving, for example. The projector 800 can also perform excellent image display in which a speckle due to the laser light L is reduced.

Others

The disclosure is not limited to each exemplary embodiment as described above. The embodiment can be implemented in various aspects without departing from a gist of the embodiment.

First, the control of current and the direction of a magnetic field described in each exemplary embodiment are examples in the description above, and various modifications including a shape and disposition of each portion can be achieved appropriately. For example, it is conceivable that a coil is disposed in the lateral direction. Furthermore, a permanent magnet and a coil may be switched between each other.

Figure 8:
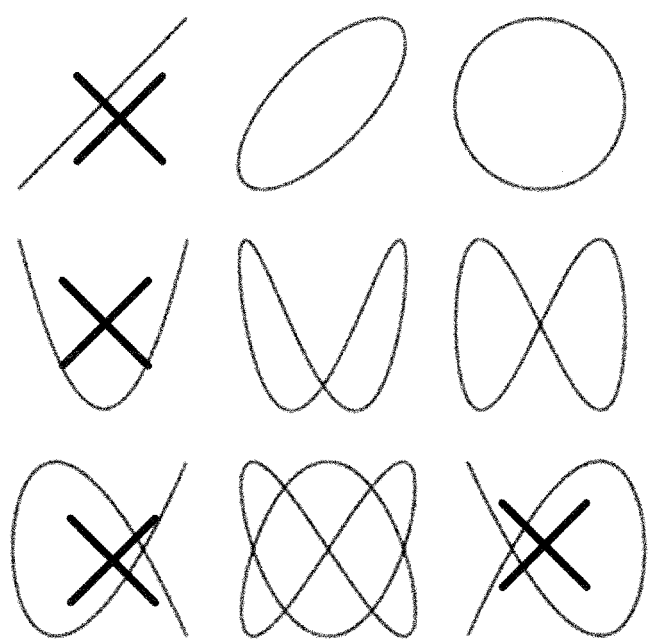
FIG. 8 is a view for exemplifying a track of motion by in-plane vibration.

Furthermore, in the description above, the circular or elliptical trajectory is exemplified as an example of curvilinear motion maintaining movement in at least one of the two vibration directions VD1 and VD2 without a velocity component of zero in any of the vibration directions during vibration. However, the curvilinear motion is not limited to this example, and various types of curvilinear motion are conceivable. For example, in the first exemplary embodiment, the two driving portions of the first driving portion 30a and the second driving portion 30b are provided, a driving frequency can be set individually, and a phase difference between the two can also be provided. Therefore, a track such as a Lissajous's figure can be delineated. However, from a viewpoint of generating a curved line without a velocity component of zero, namely, movement without stopping at any moment, as exemplified in FIG. 8, a Lissajous's figure in which a line of a track stops and turns back (X sign in FIG. 8) is not selected.

Furthermore, in the description above, description is made on the case where the driving portion includes the two (the two pairs of) driving mechanisms and the case where the driving portion includes the one (the pair of) driving mechanism. However, the driving portion is not limited to these cases, and, for example, the driving portion may include three (three pairs of) driving mechanisms. For example, in FIG. 1A, the permanent magnet may be housed and fixed in not only the vibration separating portion VIb but also the vibration separating portion VIa to further improve excitation force on the second beam portions 12a and 12b constituting the outer beams.

The entire disclosure of Japanese Patent Application No. 2017-208895, filed Oct. 30, 2017 is expressly incorporated by reference herein.

What is claimed is:
1. An actuator comprising:
a movable portion;
a first beam portion coupled to the movable portion;
a second beam portion coupled to the first beam portion and extending in a direction different from a direction of the first beam portion; and
a driving portion configured to cause the movable portion to undergo curvilinear motion via the first beam portion and the second beam portion by vibration in an in-plane direction of a plane parallel to the direction in which the first beam portion extends and the direction in which the second beam portion extends, wherein
at least one of the first beam portion and the second beam portion includes an out-of-plane vibration suppressing structure configured to suppress vibration of the movable portion in an out-of-plane direction vertical to the in-plane direction.

2. The actuator according to claim 1, wherein
the out-of-plane vibration suppressing structure has a thickness in the out-of-plane direction larger than a thickness in the in-plane direction in at least one of the first beam portion and the second beam portion.

3. The actuator according to claim 1, wherein
the first beam portion constitutes an inner beam extending in a first direction and including the movable portion mounted at a center, and
the second beam portion constitutes a pair of outer beams provided at both ends of the first beam portion and extending in a second direction.

4. The actuator according to claim 3, wherein
the first beam portion constituting the inner beam includes a hole.

5. The actuator according to claim 3, wherein
the first beam portion includes, as the out-of-plane vibration suppressing structure, a plurality of members spaced apart from each other and extending in parallel to the direction in which the first beam portion extends.

6. The actuator according to claim 3, further comprising:
a vibration separating portion provided at a coupling place at which the first beam portion intersects the second beam portion and configured to separate vibration.

7. The actuator according to claim 3, wherein
the driving portion is disposed along the direction in which the first beam portion extends.

8. The actuator according to claim 1, wherein
the movable portion undergoes, as the curvilinear motion by the driving portion, motion maintaining movement in at least one of two vibration directions generated by excitation from the driving portion.

9. The actuator according to claim 1, wherein
the first beam portion and the second beam portion are configured to cause a resonant mode different from a resonant mode corresponding to vibration in the out-of-plane direction to be a resonant mode corresponding to vibration in the in-plane direction, and
the driving portion is configured to operate at a driving frequency corresponding to the resonant mode in the in-plane direction and cause the movable portion to resonate and vibrate.

10. An optical device comprising:
the actuator according to claim 1; and
an optical element provided in the movable portion and configured to make the curvilinear motion.

11. The optical device according to claim 10, wherein
the optical element includes a light diffusion plate.

12. A projector comprising:
the optical device according to claim 10, wherein
the projector is configured to perform image projection with laser light reflected by the optical device.

* * * * *